(12) United States Patent
Tang

(10) Patent No.: US 12,411,728 B2
(45) Date of Patent: Sep. 9, 2025

(54) NAND FAST CYCLIC REDUNDANCY CHECK

(71) Applicant: SanDisk Technologies LLC, Addison, TX (US)

(72) Inventor: Tianyu Tang, Milpitas, CA (US)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 0 days.

(21) Appl. No.: 17/943,617

(22) Filed: Sep. 13, 2022

(65) Prior Publication Data

US 2024/0086277 A1    Mar. 14, 2024

(51) Int. Cl.
  *G06F 11/10* (2006.01)
  *G06F 11/07* (2006.01)
  *H03K 19/21* (2006.01)

(52) U.S. Cl.
  CPC ...... *G06F 11/1004* (2013.01); *G06F 11/0772* (2013.01); *H03K 19/21* (2013.01)

(58) Field of Classification Search
  None
  See application file for complete search history.

(56) References Cited

U.S. PATENT DOCUMENTS

| | | | |
|---|---|---|---|
| 5,103,451 A * | 4/1992 | Fossey | G06F 11/10 714/757 |
| 7,689,895 B2 | 3/2010 | Kim | |
| 8,332,727 B2 | 12/2012 | Kim | |
| 9,015,548 B2 | 4/2015 | Sakaue | |
| 9,583,215 B2 | 2/2017 | Jeong | |
| 10,482,921 B2 | 11/2019 | Dietrich | |
| 2005/0289441 A1 * | 12/2005 | Kawagoe | G06F 11/1008 714/763 |
| 2009/0077153 A1 * | 3/2009 | Dobbelaere | G06F 7/724 708/520 |
| 2013/0082736 A1 | 4/2013 | Dono | |
| 2022/0223220 A1 * | 7/2022 | Yoon | G11C 29/42 |

FOREIGN PATENT DOCUMENTS

WO    WO-2022126358 A1 *  6/2022

OTHER PUBLICATIONS

Wikipedia, "XNOR gate"—(Aug. 7, 2014) (Year: 2014).*

(Continued)

*Primary Examiner* — Mark D Featherstone
*Assistant Examiner* — Matthew W Wahlin
(74) *Attorney, Agent, or Firm* — Sheppard, Mullin, Richter & Hampton LLP

(57) ABSTRACT

The present disclosure relates generally to a method of detecting errors in programming data. The method includes receiving a frame of encoded data, and performing a pre-calculation operation on the encoded data. The pre-calculation operation includes passing the frame of encoded data through an error detection circuit comprising eight error flag implementation circuits comprising a plurality of two-input XOR logic gates configured to perform a mathematical equation to return a single output value and an eight input OR logic gate coupled to each output of each error flag implementation circuit. The eight input OR logic gate is configured to return an error flag if one or more output values return a value of 1.

23 Claims, 16 Drawing Sheets

(56) References Cited

OTHER PUBLICATIONS

Synopsys,web.archive.org_web_20210226125030_ (Year: 2021).*
"Electronics_Tuorials.COM", "Shift Register—Parallel and Serial Shift Register", (Sep. 26, 2014) (Year: 2014).*
Shelley, B.; The CMOS Inverter Explained; https://courseware.ee.calpoly.edu/~dbraun/courses/ee307/F02/02_Shelley/Section2_BasilShelley.htm; website accessed on Jun. 10, 2022; 4 pgs.
Geeksforgeeks; Cyclic Redundancy Check and Modulo-2 Division; GeeksforGeeks; May 25, 2022; https://www.geeksforgeeks.org/modulo-2-binary-division/; website accessed on Jun. 10, 2022; 17 pgs.
Wikipedia; Cyclic redundancy check; Wikipedia; Jun. 3, 2022; https://en.wikipedia.org/wiki/Cyclic_redundancy_check; website accessed on Jun. 9, 2022; 16 pgs.
Greenberg, M.; Do you need DDR4 Write CRC?—Committed to Memory; Synopsys; Jun. 24, 2015; https://blogs.synopsys.com/committedtomemory/2015/06/24/do-you-need-ddr4-write-crc/; website accessed on Jun. 9, 2022; 6 pgs.

* cited by examiner

NAND FAST CYCLIC REDUNDANCY CHECK

BACKGROUND

Flash memory is an electronic, non-volatile computer memory storage medium that can be electrically erased and reprogrammed. Flash memory is widely used across a range of products and industries including computers, mobile phones, tablet devices, personal digital assistants (PDAs), digital audio players, digital cameras, video games, scientific instrumentation, industrial robotics, and medical electronics, to name a few. NAND flash memory—one of the two primary types of flash memory—can be found in memory cards, USB flash drives, solid-state drives, smartphones, and the like. NAND flash may employ floating gate transistors, such as floating gate metal-oxide-semiconductor field-effect transistors (MOSFETs), connected in a manner that resembles a NAND logic gate to store a charge which represents a data state.

However, programming data can sometimes contain errors. Performing a frame integrity check operation on each byte or groups of bytes in a transmission frame can check for errors in programming data. The frame integrity check operation sorts through each byte in a frame of programming data to verify whether the data in the frame is correct. The simplest form of the frame integrity check is a longitudinal parity checksum. The longitudinal parity checksum consists of an additional byte added at the end of each transmission frame by the sender. The receiver performs the same operation as the sender and compares the calculated value with the received checksum. If both values match, the frame is valid. If not, the frame is invalid. Unfortunately, parity bits often fail to identify two data bit errors within a word, instead solely flagging single bit errors in the frame.

Another form of integrity check is a cyclic redundancy check (CRC). The CRC, is a powerful method for detecting errors in the received data. A CRC groups bytes of data into a block and performs an integrity check. Typically, the CRC is calculated by performing a modulo 2 division of the data by a generator polynomial (i.e., a divisor), and recording the remainder after the division. Although this division may be performed in software, it is typically performed using a shift register or plurality of XOR gates.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 5 is an example illustration of a CRC frame integrity check, according to one embodiment.

Figure 1:
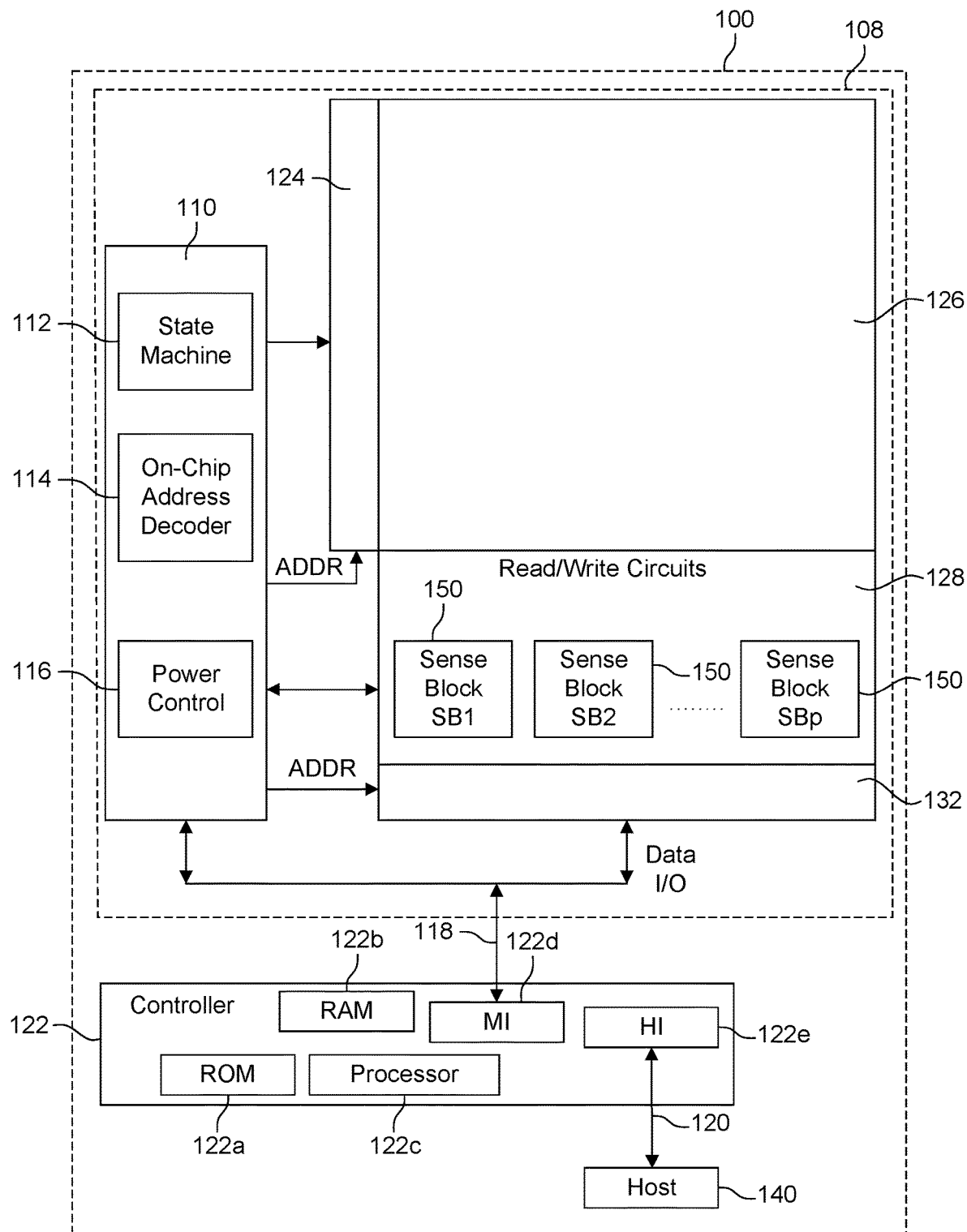
FIG. 1 is a block diagram of an example memory device, in connection with which, example embodiments of the disclosed technology can be implemented.

The figures are not exhaustive and do not limit the present disclosure to the precise form disclosed.

DETAILED DESCRIPTION

A cyclic redundancy check (CDC) is an error-detecting code commonly used in digital networks and storage devices to detect accidental changes to digital data. Blocks of data entering these systems receive a short check value attached to the data. The short check value is based on the remainder of a polynomial division of their contents. On retrieval, the calculation is repeated and, in the event the check values do not match, corrective action can be taken against data corruption. For example, in a frame integrity check operation, CRCs can be used to check a set (e.g., a frame) of programming data. The controller performs a mathematical calculation on a block of data and returns a number that represents the content and organization of that data. The number can be used to determine if the frame has been modified, corrupted, or altered during transfer. Before writing data into memory, it is beneficial to verify that no errors in the data are present.

Implementation of the CRC code requires a generator polynomial. The generator polynomial is used as a divisor in a polynomial long division of the programming data. As is typical in long division, the quotient is discarded and the remainder becomes the result. However, an important caveat is that the polynomial coefficients are calculated according to the arithmetic of a finite field, so the addition operation can always be performed bitwise-parallel such that there is no carry between digits. All commonly used CRCs use a finite field of two elements. The two elements are usually called 0 and 1, comfortably matching computer architecture.

The CRC encoder typically resided on-chip. However, in an embodiment where the CRC encoder resides off-chip (e.g., an encoder on a host device), the CRC-enabled device can calculate a short, fixed-length binary sequence (i.e., one or more CRC bits), known as the check value. During an write operation, a check value (i.e., CRC data) is appended to programming data to create a codeword that is sent to the NAND. When a codeword is received, the NAND device compares its check value with one freshly calculated from the data block, or equivalently, performs a CRC on the whole codeword and compares the resulting check value with an expected residue constant. If the CRC values do not match, then the block contains a data error. The device may take corrective action, such as re-reading the block or requesting that it be sent again. Otherwise, the data is assumed to be error-free.

In one embodiment, a controller generates CRC data (i.e., one or more CRC bits) from the program data transmitted in a write burst and transmits that CRC data following the programming data (e.g., appended to the programming data). The CRC data received from the controller is not stored in the NAND, rather, the NAND checks the CRC data it received against the programming data that the NAND received. If a mismatch is detected, the NAND sends (i.e., reports) a status to the I/O pin shortly after the write, indicating that a problem has occurred. The system may then choose to retransmit the data or follow some error recovery procedure.

FIG. 1 is a block diagram of an example non-volatile memory system 100. In one embodiment, the non-volatile memory system 100 is a card-based system, such as a secure digital (SD) or a micro secure digital (micro-SD) card. In an alternate embodiment, memory system 100 is part of an embedded memory system. For example, the flash memory may be embedded within the host. In other examples, memory system 100 can be a solid state drive (SSD). The non-volatile memory system 100 includes one or more non-volatile memory dies 108, and a controller 122. The memory die 108 can be a complete memory die or a partial memory die. As seen here, the memory die 108 includes a memory structure 126, control circuitry 110, and read/write/erase circuits 128. The memory structure 126 is addressable by wordlines via a row decoder 124 and by bitlines via a column decoder 132. The read/write/erase circuits 128 include multiple sense blocks 150 including SB1, SB2, . . . , SBp (hereinafter referred to as sensing circuitry). The read/write/erase circuits 128 and sensing circuitry allow a page of memory cells to be read, programmed, or erased in parallel.

In one embodiment, memory structure 126 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 126 comprises a two-dimensional (2D) memory array of non-volatile memory cells. In one example, the non-volatile memory cells are NAND flash memory cells utilizing floating gates.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include 2D arrays, 3D arrays, and other memory structures that may have a string configuration. Although current iterations of other memory structure (e.g., MRAM, PCM, and Spin RAM) are configured without a string, memories of these cells can be configured into a topology that has a string, and thus could be utilized in a format that would allow them to be erased in a block format and programmed in chunks. Thus, in this potential configuration, embodiments of the disclosure could be foreseeably applied.

A person of ordinary skill in the art will recognize that the technology described herein is not limited to a single specific memory structure, but covers many relevant memory structures within the spirit and scope of the technology as described herein and as understood by one of ordinary skill in the art.

The control circuitry 110 cooperates with the read/write/erase circuits 128 to perform memory operations (e.g., write, read, erase) on memory structure 126, and includes state machine 112, an on-chip address decoder 114, and a power control circuit 116. In one embodiment, control circuitry 110 includes buffers such as registers, read-only memory (ROM) fuses and other storage devices for storing default values such as base voltages and other parameters. The on-chip address decoder 114 provides an address interface between addresses used by host 140 or controller 122 and the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks 150 include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. Such a control circuit can include hardware only or a combination of hardware and software (including firmware). For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally.

The controller 122 interfaces with the one or more memory dies 108. In one embodiment, controller 122 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the non-volatile storage system 100 may include one memory die 108 connected to one controller 122. Other embodiments may include multiple memory dies 108 in communication with one or more controllers 122. In one example, the multiple memory dies 108 can be grouped into a set of memory packages. Each memory package may include one or more memory dies 108 in communication with controller 122. In one embodiment, a memory package includes a printed circuit board (or similar structure) with one or more memory dies 108 mounted thereon. In some embodiments, a memory package can include molding material to encase the memory dies 108 of the memory package. In some embodiments, controller 122 is physically separate from any of the memory packages.

In one embodiment, a controller 122 is included in the same package (e.g., a removable storage card) as the memory die 108. In other embodiments, the controller is separated from the memory die 108. In some embodiments the controller is on a different die than the memory die 108. In some embodiments, one controller 122 communicates with multiple memory dies 108. In other embodiments, each memory die 108 has its own controller. Commands and data are transferred between a host 140 and controller 122 via a data bus 120, and between controller 122 and the memory die 108 via lines 118. In one embodiment, memory die 108 includes a set of input and/or output (I/O) pins that connect to lines 118.

The controller 122 includes one or more processors 122*c*, ROM 122*a*, random access memory (RAM) 122*b*, a memory interface (MI) 122*d*, and a host interface (HI) 122*e*, all of which may be interconnected. The storage devices (ROM 122*a*, RAM 122*b*) store code (software) such as a set of instructions (including firmware), and one or more of the processors 122*c* are operable to execute the set of instructions to provide functionality described herein (e.g., non-transitory computer readable storage medium). Alternatively or additionally, one or more processors 122*c* can access code from a storage device in the memory structure, such as a reserved area of memory cells connected to one or more wordlines. RAM 122*b* can be used to store data for controller 122, including caching program data (discussed below). MI 122*d*—in communication with ROM 122*a*, RAM 122*b*, and processor(s) 122*c*—may be an electrical circuit that provides an electrical interface between controller 122 and memory die 108. For example, MI 122*d* can change the format or timing of signals, provide a buffer, isolate from surges, latch I/O, etc. One or more processors 122*c* can issue commands to control circuitry 110 (or another component of memory die 108) via MI 122*d*. Host interface 122*e* provides an electrical interface with host 140 via data bus 120 in order to receive commands, addresses and/or data from host 140 to provide data and/or status to host 140.

Figure 2:
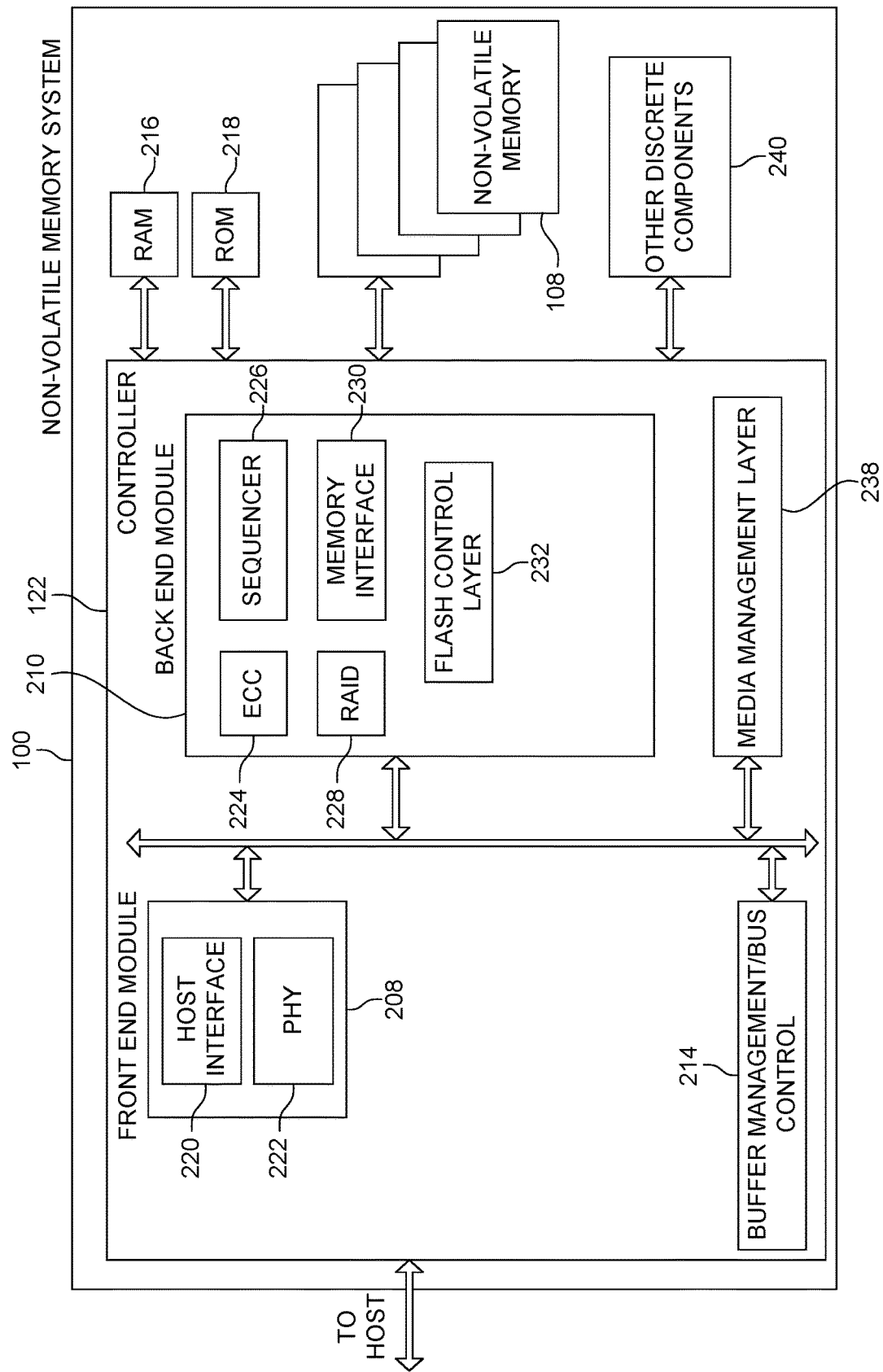
FIG. 2 is a block diagram of an example memory system, in connection with which, example embodiments of the disclosed technology can be implemented.

FIG. 2 is a block diagram of example memory system 100 that depicts more details of one embodiment of controller 122. While the controller 122 in the embodiment of FIG. 2 is a flash memory controller, it should be appreciated that the one or more non-volatile memory dies 108 are not limited to flash memory. Thus, the controller 122 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the block can be erased and reused).

In some embodiments, non-volatile memory system 100 includes a single channel between controller 122 and non-volatile memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2, controller 122 includes a front-end module 208 that interfaces with a host, a back-end module 210 that interfaces with the memory die 108, and various other modules that perform functions which will now be described in detail. The components of controller 122 depicted in FIG. 2 may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable controller 122 to perform the functions described herein. The architecture depicted in FIG. 2 is one example implementation that may (or may not) use the components of controller 122 depicted in FIG. 1 (e.g., RAM, ROM, processor, interface).

Referring again to modules of the controller 122, a buffer manager/bus control 214 manages buffers in RAM 216 and controls the internal bus arbitration of controller 122. ROM 218 stores system boot code. Although illustrated in FIG. 2 as located separately from the controller 122, in other embodiments, one or both of RAM 216 and ROM 218 may be located within the controller. In yet other embodiments, portions of RAM 216 and ROM 218 may be located within the controller 122, while other portions may be located outside the controller. Further, in some implementations, the controller 122, RAM 216, and ROM 218 may be located on separate semiconductor dies.

Front-end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fiber Channel, USB, PCIe, and NVMe. The host interface 220 typically facilitates transfer for data, control signals, and timing signals.

Back-end module 210 includes an error correction code (ECC) engine 224 that encodes the data bytes received from the host, and decodes and error corrects the data bytes read from the non-volatile memory 108. A command sequencer 226 generates command sequences, such as program and erase command sequences, to be transmitted to non-volatile memory 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one or more extra dies, or may be added within the existing die, e.g., as an extra plane, an extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or greater interface. A flash control layer 232 controls the overall operation of back-end module 210.

Additional components of system 100 illustrated in FIG. 2 include media management layer (MML) 238, which performs wear leveling of memory cells of non-volatile memory die 108, as well as, other discrete components 240, such as external electrical interfaces, external RAM, resistors, capacitors, or other components that may interface with controller 122. In alternative embodiments, one or more of the physical layer interface 222, RAID module 228, MML 238, or buffer management/bus controller 214 are optional components.

MML 238 (e.g., Flash Translation Layer (FTL)) may be integrated as part of the flash management for handling flash errors and interfacing with the host. In particular, MML 238 may be a module in flash management and may be responsible for the internals of NAND management. In particular, MML 238 may include an algorithm in the memory device firmware which translates writes from the host into writes to the memory 126 of die 108. MML 238 may be needed because: 1) the memory 126 may have limited endurance; 2) the memory 126 may only be written in multiples of pages; and/or 3) the memory 126 may not be written unless it is erased as a block (or a tier within a block in some embodiments). MML 238 understands these potential limitations of the memory 126 which may not be visible to the host. Accordingly, MML 238 attempts to translate the writes from host into writes into the memory 126.

Figure 3:
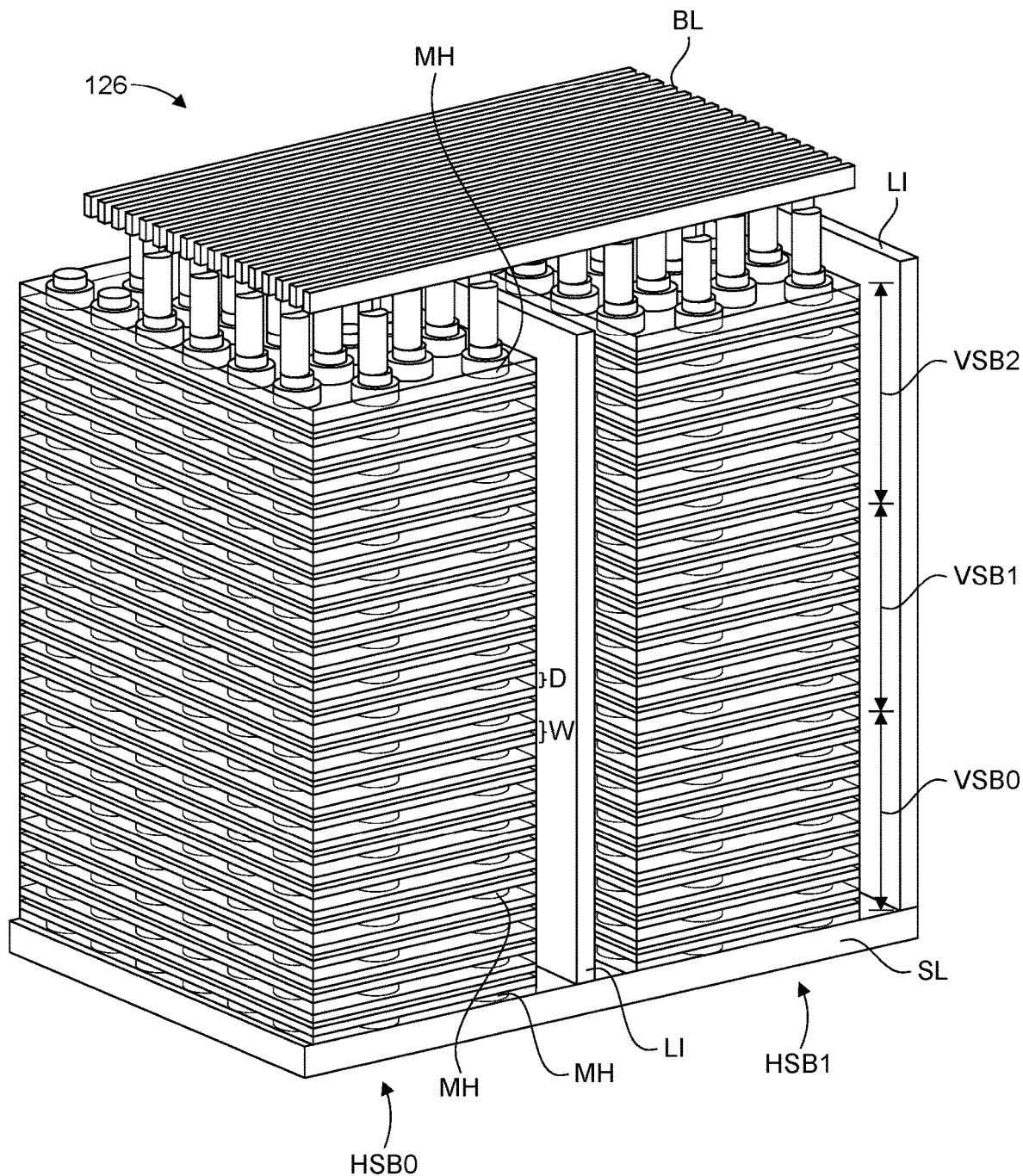
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 126 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (i.e., wordline layers) is marked as WL. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating D layers and WL layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 is provided below with respect to FIG. 4A-4G.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For purpose of discussion, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. There could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 presents challenges due to the valid data in the other vertical sub-blocks VSB0, VSB2.

Figure 4A:
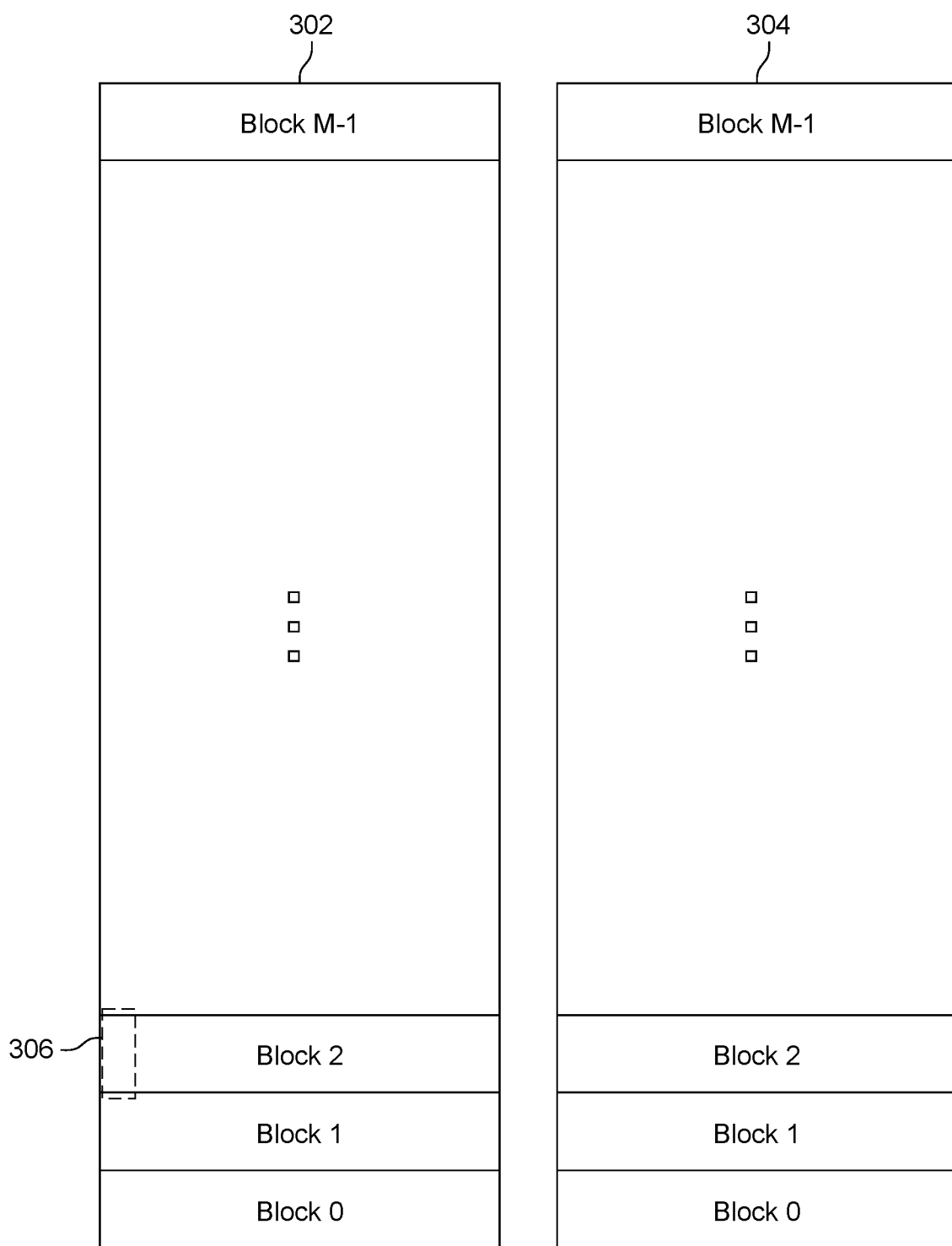
FIG. 4A is a block diagram of an example memory structure having two planes, in connection with which, example embodiments of the disclosed technology can be implemented.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of wordlines.

Figure 4B:
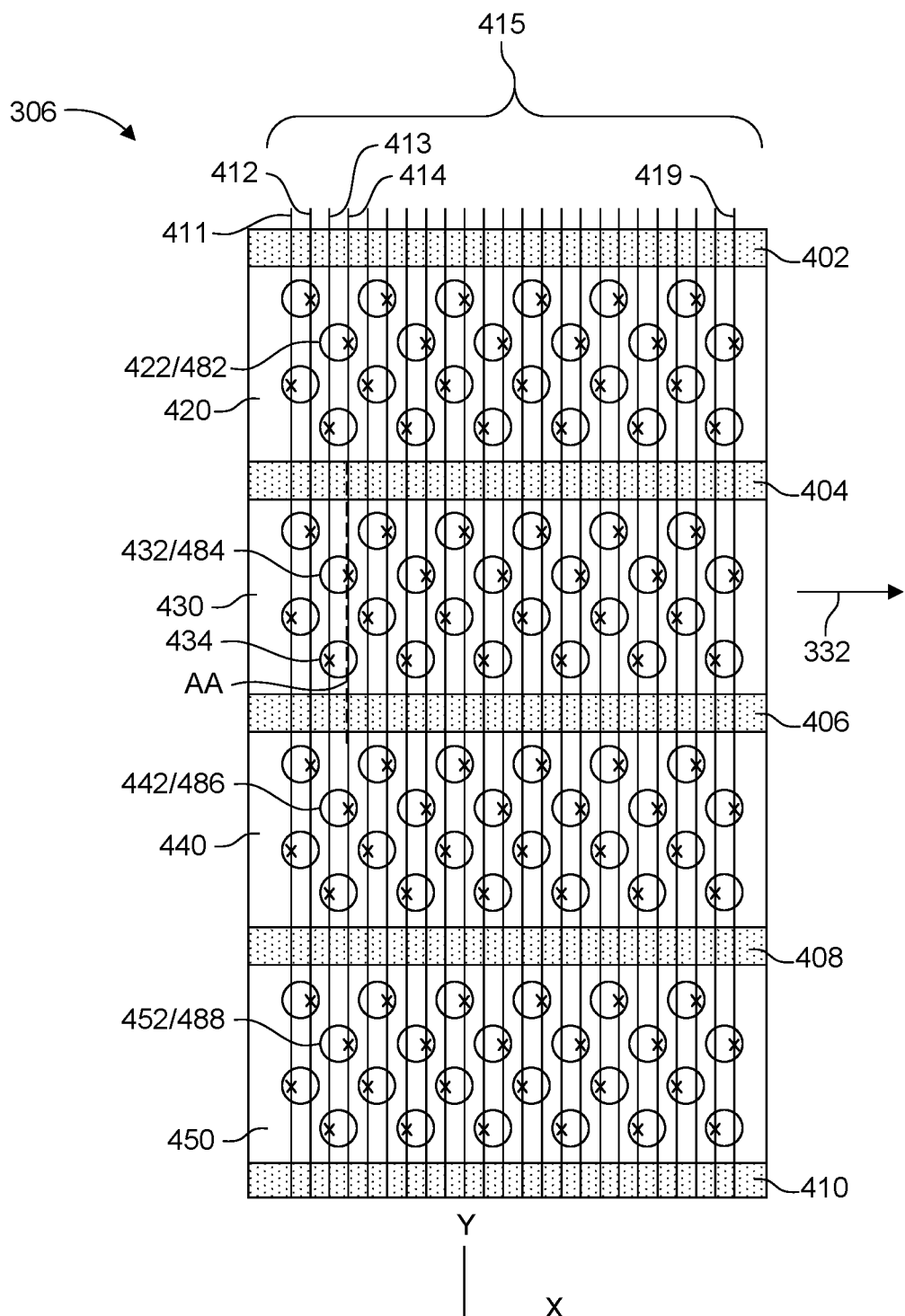
FIG. 4B depicts a top view of a portion of a block of example memory cells, in connection with which, example embodiments of the disclosed technology can be implemented.

FIGS. 4B-4F depict an example three dimensional ("3D") NAND structure that corresponds to the structure of FIG. 3 and can be used to implement memory structure 126 of FIG. 2. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of four rows connected to a common bitline are connected to the same wordline (via different wordline fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
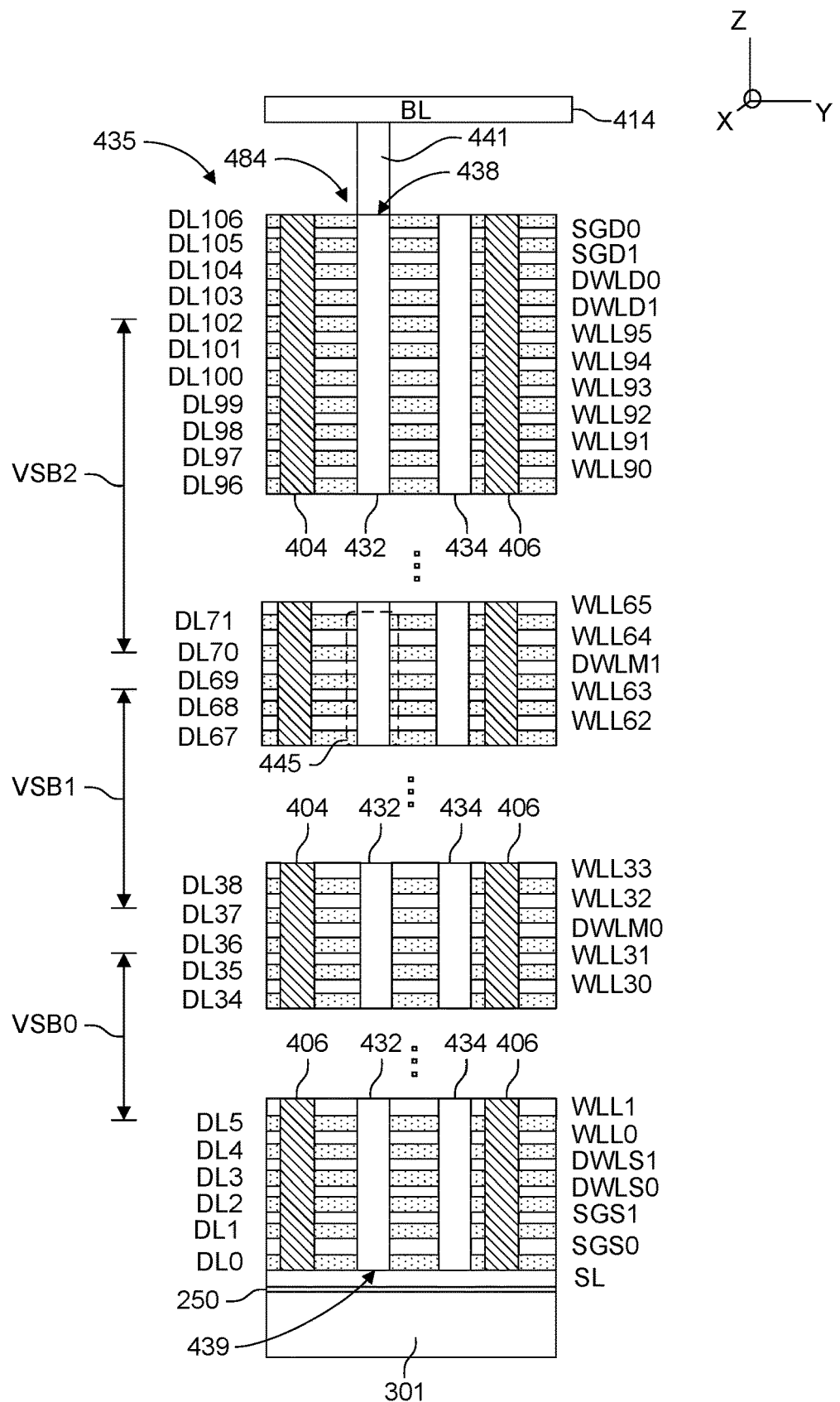
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. The following layers could also be considered to be a part of vertical sub-block VSB0 (SGS0, SGS1, DWLS0, DWLS1). Vertical sub-block VSB1 includes WLL32-WLL63. Vertical sub-block VSB2 includes WLL64-WLL95. The following layers could also be considered to be a part of vertical sub-block VSB2 (SGD0, SGD1, DWLD0, DWLD1). Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding with vertical sub-block VSB0 wordlines WLL0-WLL31) from a second set of memory cell transistors within the memory string (e.g., corresponding with the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, wherein the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, and a select line in a middle junction transistor layer.

The stack 435 may have more than three vertical sub-blocks. For example, the stack 435 may be divided into four, five or more vertical sub-blocks. Each of the vertical sub-block contains at least one data memory cell. There may additional layers similar to the middle dummy wordline layers DWLM in order to divide the stack 435 into the additional vertical sub-blocks. In one embodiment, the stack has two vertical sub-blocks.

Figure 4D:
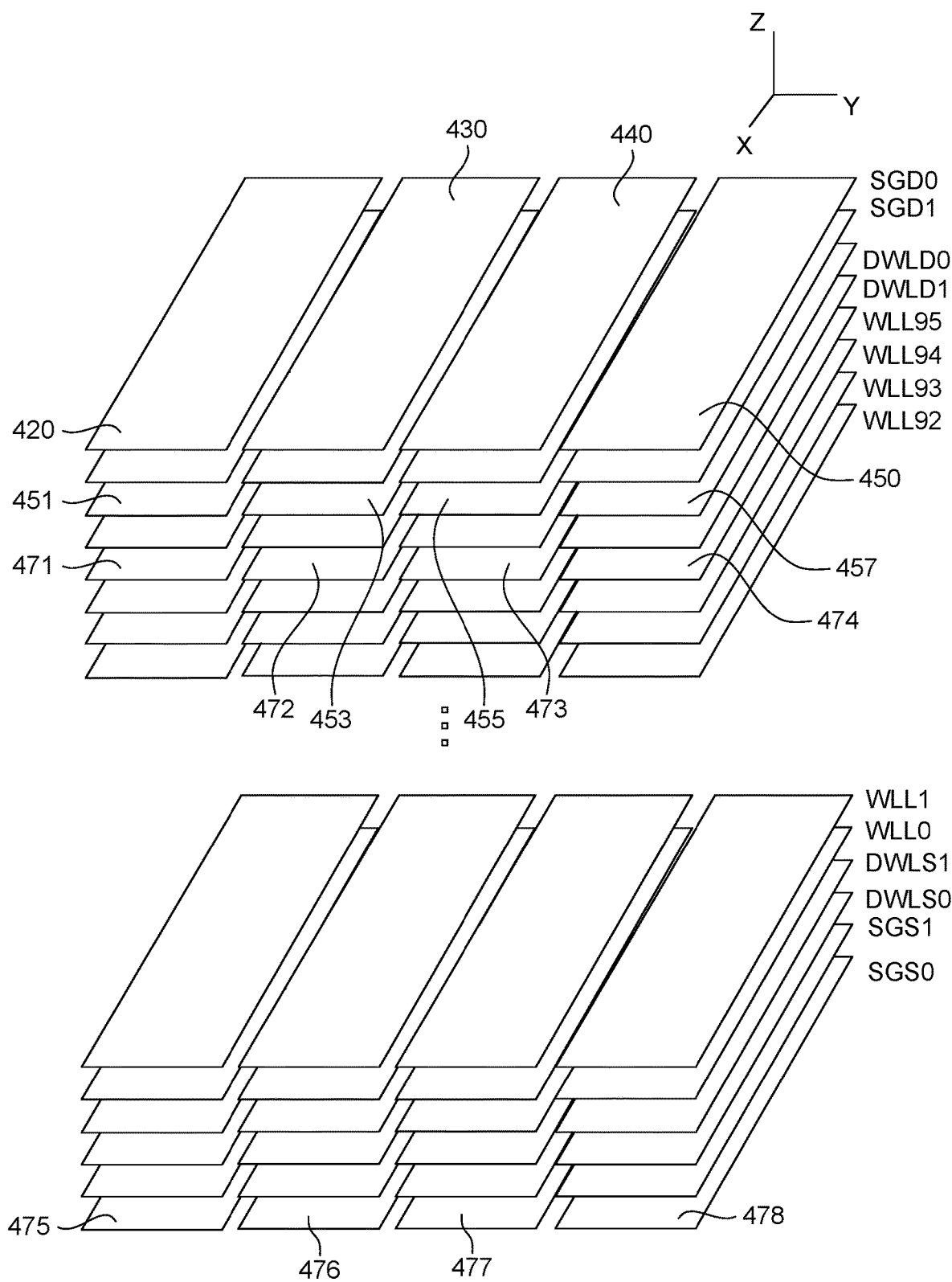
FIG. 4D depicts an alternative view of the select gate layers and wordline layers.

FIG. 4D depicts an alternative view of the SG layers and wordline layers of the stack 435 of FIG. 4C. The SGD layers SGD0 and SGD0 (the drain-side SG layers) each includes parallel rows of SG lines associated with the drain-side of a set of NAND strings. For example, SGD0 includes drain-side SG regions 420, 430, 440 and 450, consistent with FIG. 4B.

Below the SGD layers are the drain-side dummy wordline layers. Each dummy wordline layer represents a wordline, in one approach, and is connected to a set of dummy memory cells at a given height in the stack. For example, DWLD0 comprises wordline layer regions 451, 453, 455 and 457. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source-side dummy wordline layers. Below the source-side dummy wordline layers are the SGS layers. The SGS layers SGS0 and SGS1 (the source-side SG layers) each includes parallel rows of SG lines associated with the source-side of a set of NAND strings. For example, SGS0 includes source-side SG lines 475, 476, 477 and 478. Each SG line can be independently controlled, in one approach. Or, the SG lines can be connected and commonly controlled.

Figure 4E:
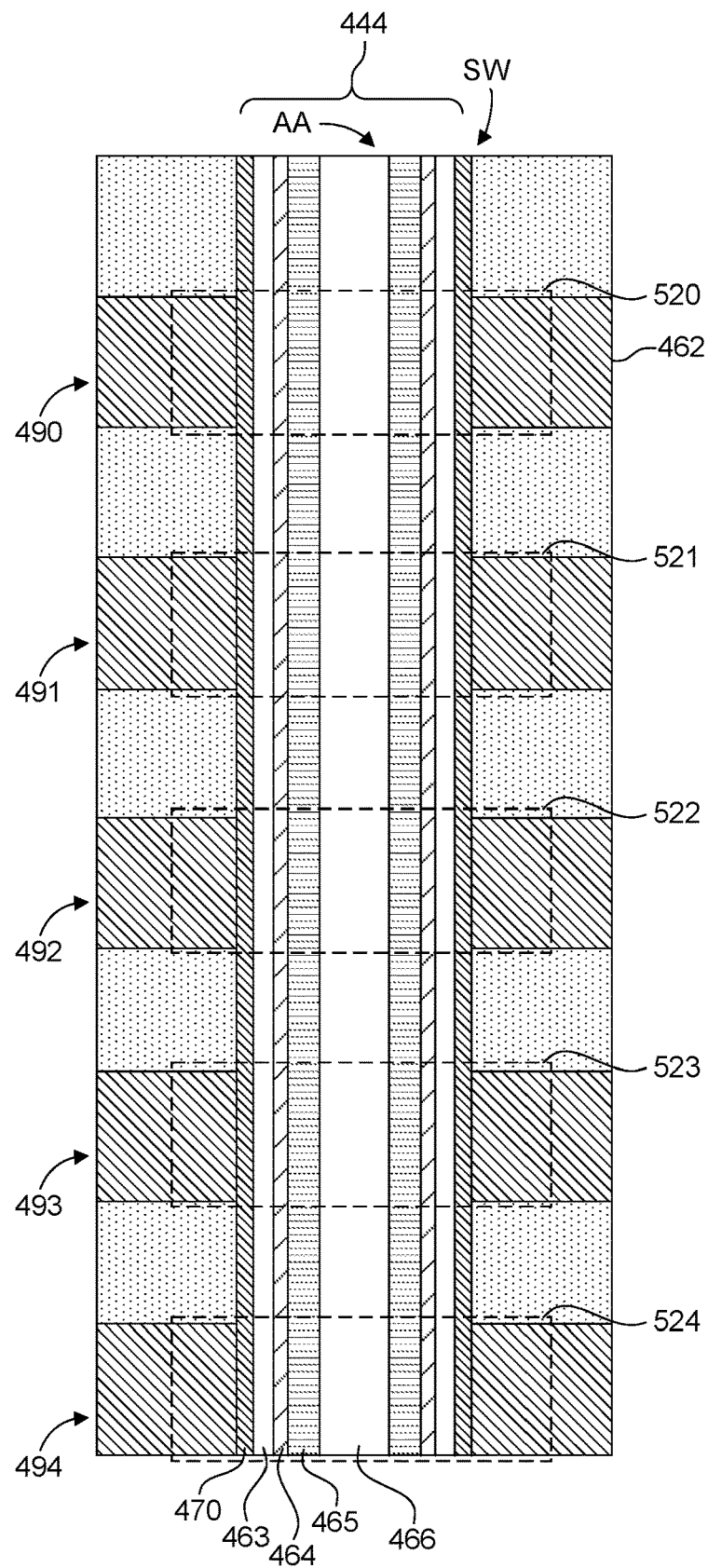
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel. For example, in one embodiment, the erase operation includes removing electrons from the floating gate in order to change the state of the cell to 1. During the erase operation, a large negative voltage is required to repel electrons from the floating gate. This can be accomplished by grounding the control gate and applying a high voltage (e.g., about 18V or more) to the substrate. As a result, electrons are removed from the floating gate due to the FN tunneling effect.

Non-data transistors (e.g., select transistors, dummy memory cell transistors) may also include the charge trapping layer 463. In FIG. 4E, dummy memory cell transistor 522 includes the charge trapping layer 463. Thus, the threshold voltage of at least some non-data transistors may also be adjusted by storing or removing electrons from the charge trapping layer 463. It is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
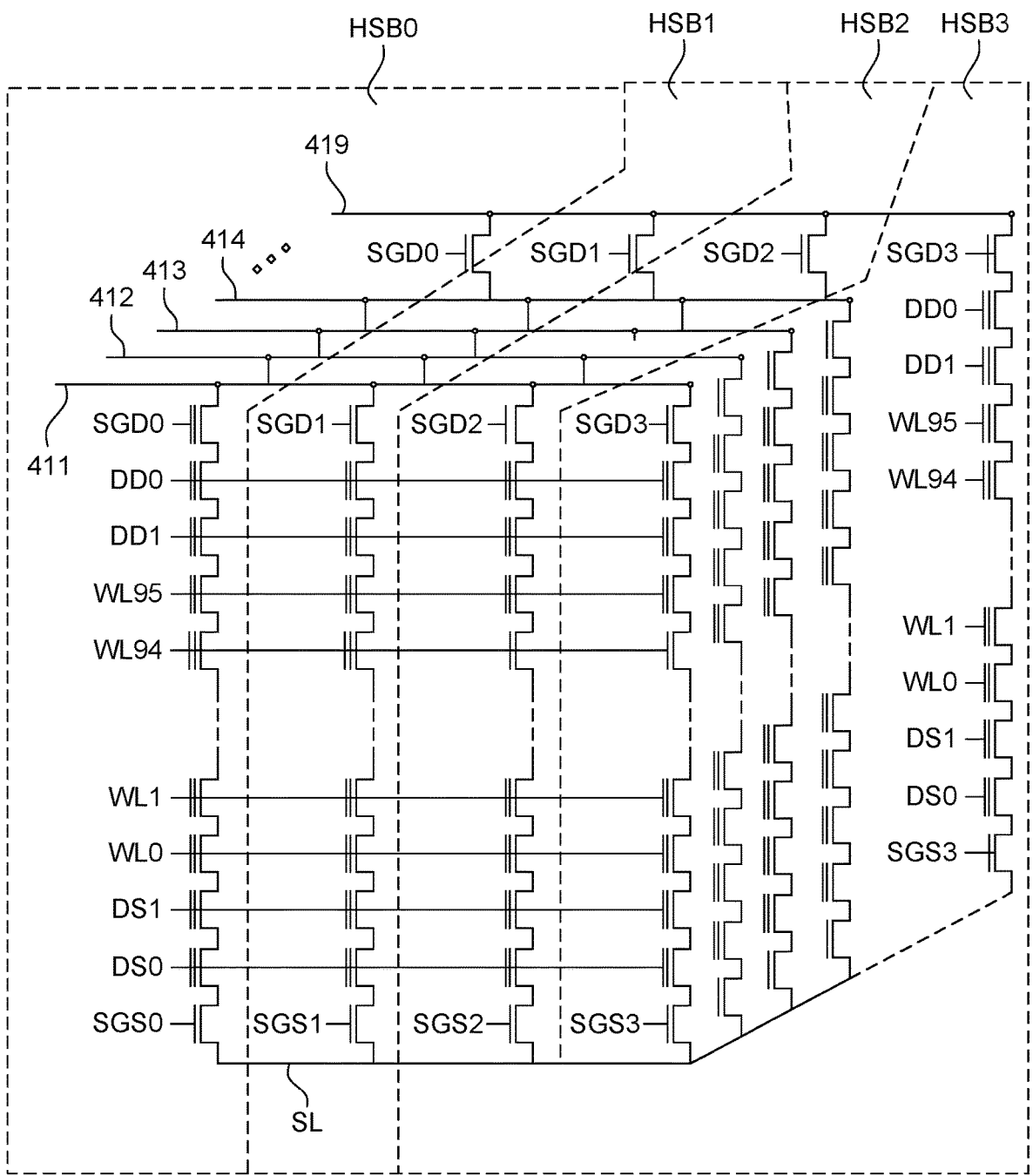
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, Horizontal sub-block HSB1 corresponds to those vertical NAND strings controlled by SGD1 and SGS1, Horizontal sub-block HSB2 corresponds to those vertical NAND strings controlled by SGD2 and SGS2, and Horizontal sub-block HSB3 corresponds to those vertical NAND strings controlled by SGD3 and SGS3.

Figure 4G:
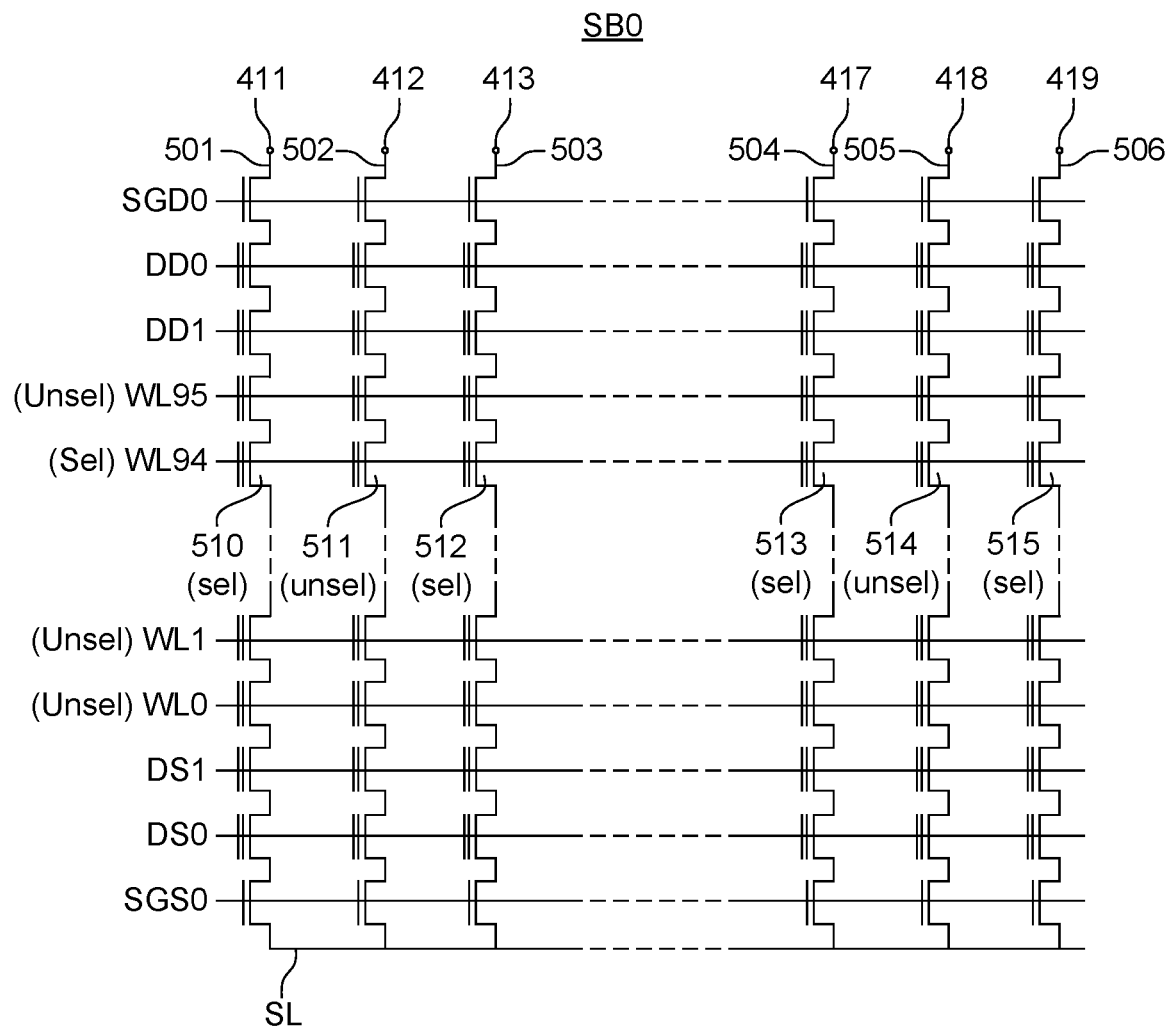
FIG. 4G is a schematic of horizontal sub-block HSB0.

FIG. 4G is a schematic of horizontal sub-block HSB0. Horizontal sub-blocks HSB1, HSB2 and HSB3 have similar structures. FIG. 4G shows physical wordlines WL0-WL95 running across the entire sub-block S0. All of the NAND strings of sub-block S0 are connected to SGD0 and SGS0. FIG. 4G only depicts six NAND stings 501, 502, 503, 504, 505 and 506; however, horizontal sub-block HSB0 will have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HS0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HS0 are selected memory cells and some of the memory cells connected to WL94 in horizontal sub-block HS0 are unselected memory cells depending on how the programming operation is performed and the data pattern being programmed. For example, those memory cells that are to remain in the erased state S0 will be unselected memory cells, because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unset in FIG. 4G). Additionally, assume for example purposes that memory cells 510, 512, 513 and 515 (which are connected to wordline WL94) are to be programmed to any of the data states S1-S7; therefore, memory cells 510, 512, 513 and 515 are selected memory cells (labeled sel in FIG. 4G).

Although the example memory system of FIGS. 3-4G is a three dimensional memory structure that includes vertical NAND strings with charge-trapping material, other (2D and 3D) memory structures can also be used with the technology described herein.

Figure 5:
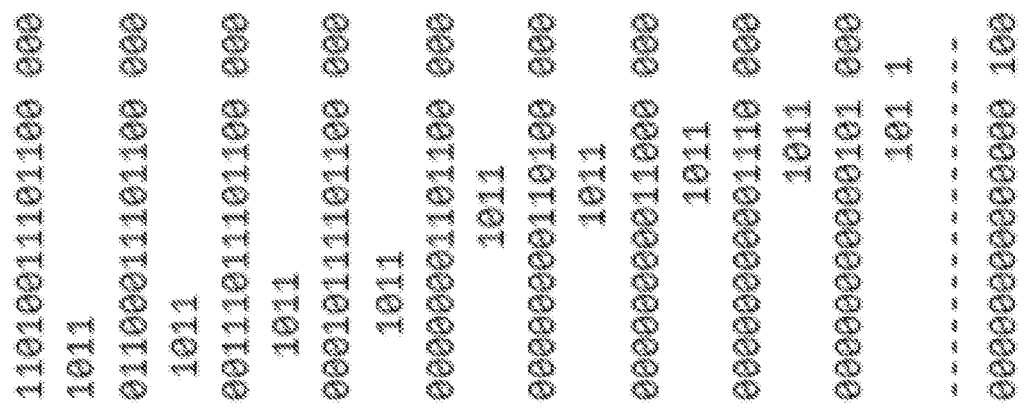

FIG. 5 is an example computation of a cyclic redundancy check (CRC) according to one embodiment. The CRC is an error detection mechanism in which a special number is appended to a set of data (e.g., a word or frame of data) to detect for changes introduced during storage or transmission. Unlike parity checking, which checks if all bits add up to an even (or odd) number, the CRC goes a step further by being able to detect more than one error within a packet. The CRC is recalculated on retrieval (i.e., receipt) and compared to a value that was originally transmitted, which can reveal certain types of error. For example, a single corrupted bit in the data results in a one-bit change in the calculated CRC, but multiple corrupt bits may cancel each other out.

Implementation of the CRC code requires a generator polynomial. The generator polynomial is used as a divisor in a polynomial long division of the programming data. As is typical in long division, the quotient is discarded and the remainder becomes the result. All commonly used CRCs use a finite field of two elements. The two elements are usually called 0 and 1, comfortably matching computer architecture. As seen in FIG. 5, the example includes 14 bits of programming data encoded with a 3 bit CRC, and a generator polynomial $x^3+x+1$. Here, the generator polynomial is written in binary as 1, 0, 1 and 1 (i.e., the coefficients $1x^3+0x^2+1x+1$). The selection of the generator polynomial is integral to implementing a successful CRC algorithm because the generator polynomial is used as the divisor when calculating the CRC. Thus, the generator polynomial is chosen to maximize the error-detecting capabilities of the CRC. In this example, the generator polynomial includes 1 bit more than the CRC bits (e.g., the generator polynomial consists of 4 bits). Various generator polynomials are available for determining the generator polynomial are available. For example, some designs include a 9 bit generator polynomial for an 8 bit CRC (i.e., CRC-8), a 17 bit generator polynomial for a 16 bit CRC (i.e., CRC-16), a 33 bit generator polynomial for a 32 bit CRC (i.e., CRC-32), and a 65 bit generator polynomial for a 64 bit CRC (i.e., CRC-64).

As seen in FIG. 5, the 14 bit set (e.g., word) of programming data:

1 1 0 1 0 0 1 1 1 0 1 1 0 0 is encoded with three additional 0s, per the 3 bit CRC, to create:

1 1 0 1 0 0 1 1 1 0 1 1 0 0 0 0 0

By performing a modulo 2 division of the data, an encoder (e.g., the encoder 622 of FIG. 6) divides the generator polynomial by the programming data. By recording the remainder value after the division, the decoder 622 determines whether an error exists in the programming data. In modulo-2 binary division, a copy of the generator polynomial (i.e., divisor) is XORed with k-bits of the dividend.

As seen in FIG. 5, the result for each iteration is the bitwise XOR of the generator divisor with the bits above it. After each division, the divisor is shifted to align with the highest remaining 1 bit in the input. The process is repeated until the divisor reaches the right-hand end of the input row. The result of the XOR operation (remainder) is (n−1) bits, which is used for the next step after 1 extra bit is pulled down to make it n bits long. When there are no bits left to pull down, the process ends. For example, if the remainder is all zeros, then the data received has no error.

Since the leftmost divisor bit zeroed every input bit, when this process ends, the only bits in the input row that can be nonzero are the n bits at the right-hand end of the row. These n bits are the remainder of the division step, and will also be the value of the CRC function (unless the chosen CRC specification calls for some postprocessing). The validity of a received message can easily be verified by performing the above calculation again using a decoder (e.g., the decoder of FIG. 6). However, this time with the check value will include the CRC data added instead of zeros. The remainder should equal zero if there are no detectable errors in the programming data.

FIG. 6 is an example of an error detection circuit 610 configured to detect errors in programming data. The error detection circuitry 610 includes a controller, having an encoder 622A and decoder 638B, and a NAND memory array, having an encoder 622B and decoder 638A. Each encoder (i.e., encoder 622A, 622B) includes a fast CRC circuit 650 for encoding programming data by appending a dividend CRC remainder to the programming data. Each decoder (i.e., decoder 638A, 638B) includes the fast CRC circuit 650 for decoding programming data appended with the dividend CRC remainder, by conducting a CRC to determine whether the remainder is a 0. In one embodiment, the error detection circuitry appends one or CRC bits to each set of programming data (e.g., one or more frames or words) and performs a pre-calculation CRC operation on the programming data containing one or more CRC bits to determine whether any programming error exists in the programming data. Examples of errors that the error detection circuitry 610 may be capable of detecting include random single-bit errors, random double bit errors, random odd count errors, and random multi-bit UI vertical column error detection (excluding DBI bits).

Figure 6A:
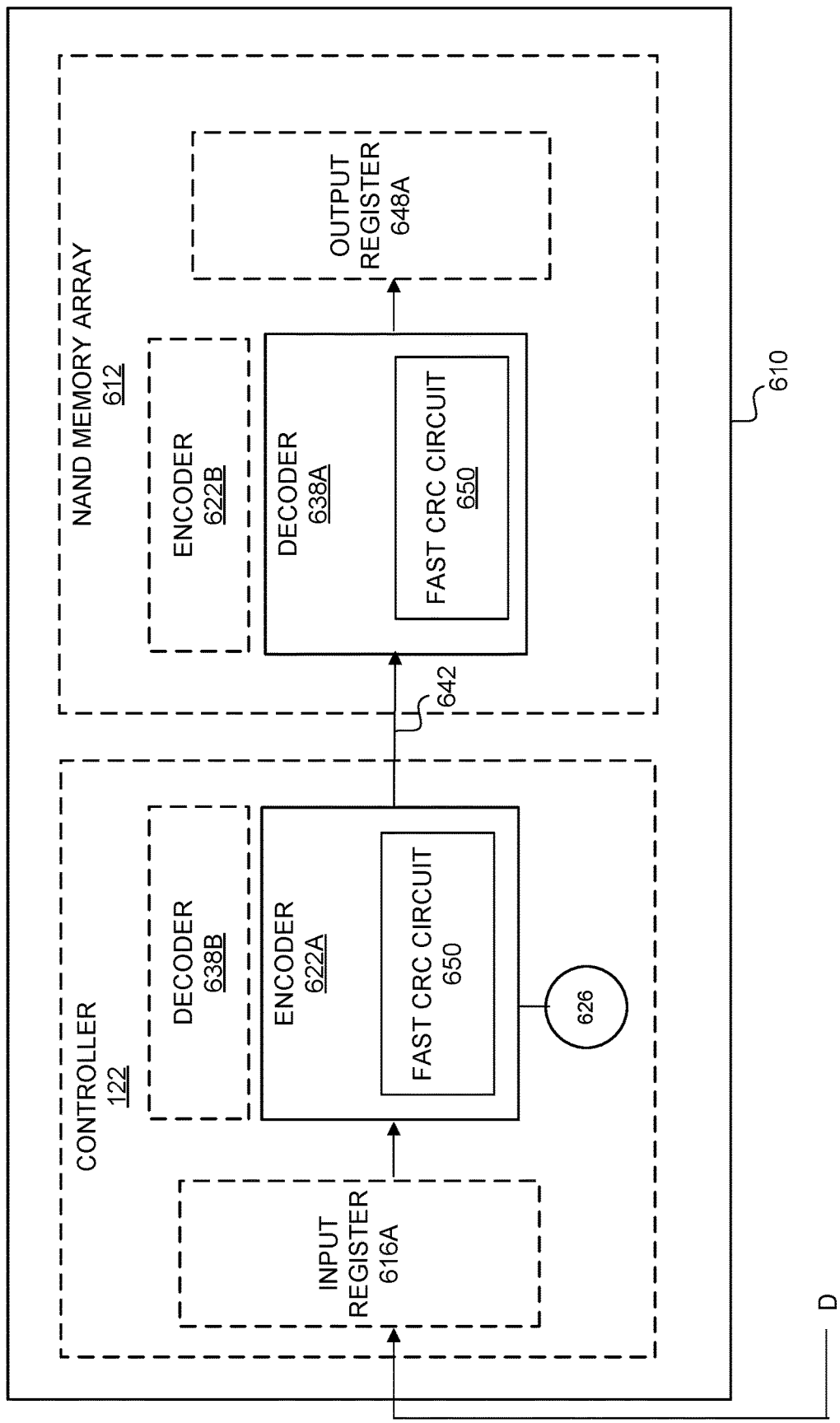
FIG. 6A is a schematic block diagram depicting an example integrated circuit that can be used to implement one or more embodiments of the disclosed technology, according to one embodiment.
Figure 6B:
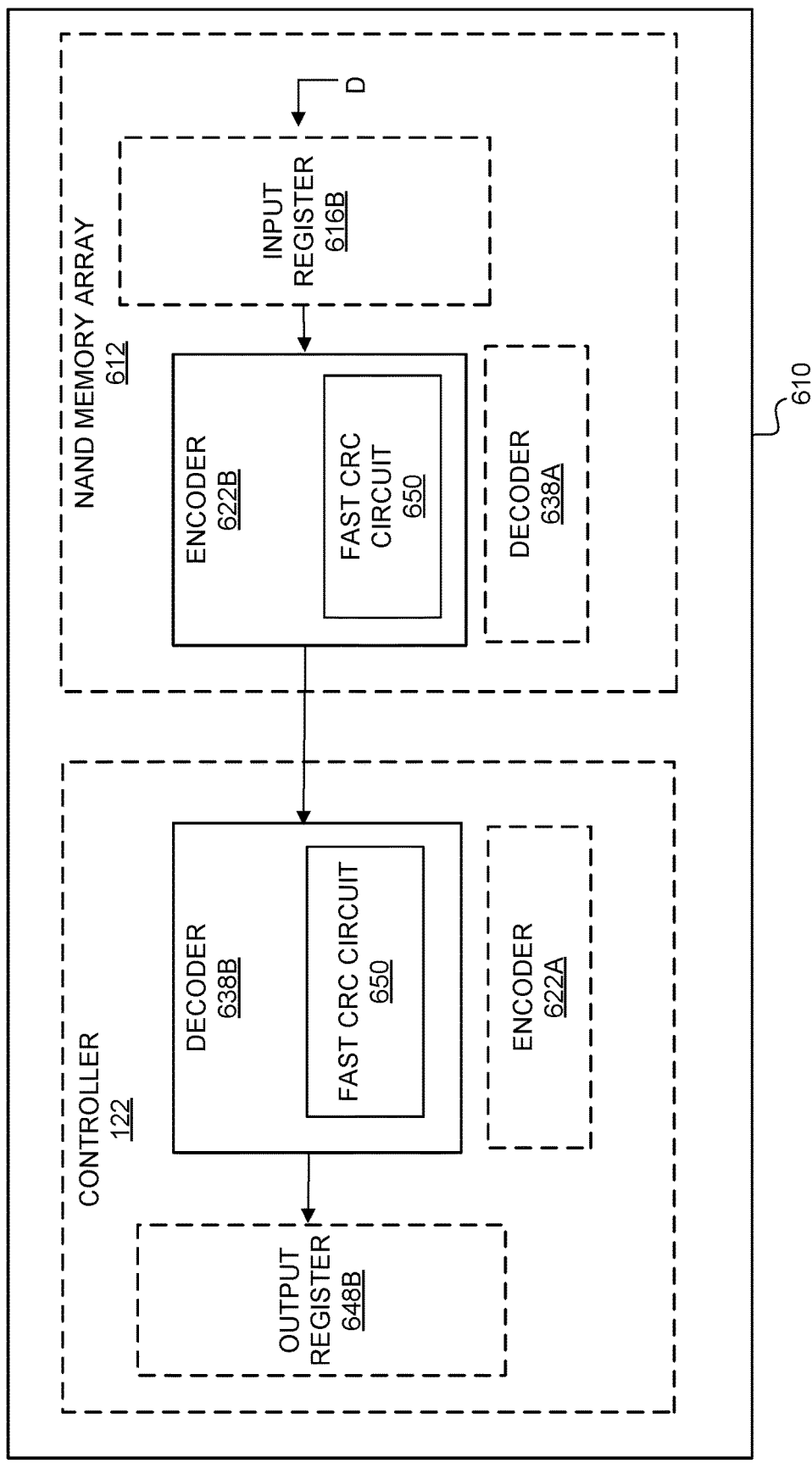
FIG. 6B is a schematic block diagram depicting an example integrated circuit that can be used to implement one or more embodiments of the disclosed technology, according to one embodiment.

As seen in FIGS. 6A-6B, in one embodiment, the controller 122 includes the encoder 622A and the decoder 638B, and the NAND memory array 612 includes the encoder 622B, and decoder 622A. Both the controller 122 and the NAND memory array 612 can include respective encoders 622A, 622B, and decoders 622A, 622B, for read/write operations. For example, during a write operation, programming data is encoded at the controller 122, and decoded at the NAND memory array 612 (i.e., programming data is encoded by the encoder 622 located on the controller 122, and sent by the controller to the decoder 638 located on the NAND memory array 612). During a read operation, programming data is encoded at the NAND memory array 612, and decoded at the controller 122 (i.e., programming data is encoded by the encoder 622 located on the NAND memory array 612, and sent by the NAND to the decoder 638 located on the controller).

As seen in FIG. 6A, during a write operation, programming data encoded with appended CRC remainders (e.g., non 0) is sent from the encoder 622, located on the controller 122, to the decoder 638, located on the NAND memory array 612. As seen in FIG. 6B, during a read operation, programming data encoded with appended CRC remainders is sent from the encoder 622, located on the NAND memory array 648, to the decoder 638, located on the controller 122. As shown in FIGS. 6A-6B, in one embodiment, the error detection circuit 610A, 610B include an input register 616A, 616B communicatively coupled to the encoder 622A, 622B, and a decoder 638A, 638B, comprising a fast CRC circuit 650A, 650B, communicative coupled to the output register 648A, 648B respectively.

During a write operation, input register 616A may receive 72 bits of programming data D (i.e., programming bits 0-63 and 8 CRC bits) from an off-chip device (i.e., a host). During a read operation, input register 616B may receive 72 bits of programming data D from the NAND memory array 612. In another embodiment, the input register 616A, may receive 144 bits of programming data D (i.e., programming bits 0-143 and 16 CRC bits) from an off-chip device, and the input register 616B, may receive 144 bits of programming data D (i.e., programming bits 0-143 and 16 CRC bits) from the NAND memory array 612. The programming data D represents data to be loaded into, or read from, a desired group of memory cells. The size of the input register 616A, 616B may vary with the number of data bits in a frame. If desired, only a subset of the frame may be loaded (e.g., a "word" of programming data bits may be loaded into the input register 616. The size of the input register 616 may vary with the number of data bits in a frame. In one embodiment, each word includes 16 bits of data, and each frame includes 32 words. If desired, a frame may include more or less than 64 bytes of data, and the input register may receive and latch more or less than 64 bytes of data. Input register 516 may output a first portion of its data bits (e.g., 32 out of the 64 data bits) to encoder 522.

As shown in FIG. 6A, encoder 622A, may have a control input that is connected to a storage element such as storage element 626. Storage element 626 may be a volatile memory element. Storage element 626 may provide a control bit that is used to enable encoder 622 during error detection mode or to disable encoder 622 during normal operation. For example, during a read/write operation a frame containing 72 bits of data (i.e., 8 bytes of programming data and 1 byte of CRC data) may be encoded with one or more CRC bits (i.e., CRC data). The CRC bits can be determined using the following 8-bit generator polynomial:

$$G(X)=X_8+X_7+X_6+X_3+X_2+X+1$$

In another embodiment, a frame containing 144 bits of data (i.e., 16 bytes of programming data and 2 bytes of CRC data) can be encoded with one or more CRC bits. The CRC bits can be determined using the following 16-bit generator polynomial:

$$G(X)=X_{16}+X_{15}+X_2+1$$

As shown in FIG. 6, the decoder 638 may receive data from the encoder 622. A selected frame (or word) may be sent from the encoder 622 to the decoder 638 via bus 642. The encoder may reside on-chip (as shown in FIG. 6), or may reside on a host device (e.g., a user device). The encoder, may for example, generate 72 bits as its output (e.g., 64 output data bits and 8 CRC bits). The 72 bits generated at the output of the decoder 538 may further include 8 additional DBI bits. As previously mentioned, the CRC bits are used for error detection in programming data. In one embodiment, the encoder is used to generate three additional bits to a selected frame. The three additional bits can be used for the CRC. The three additional bits are referred to as "CRC bits". However, the CRC bits can include any number of bits. Typically, the amount of CRC bits ranges from 3 bits to 32 bits. For example, 16 bit CRC (i.e., CRC-16) includes 16 CRC bits, and 32 bit CRC (i.e., CRC-32) includes 32 CRC bits. By pre-calculating all 72 bits (i.e., 64 bits+8 CRC bits) the fast CRC can save time by not requiring multiple clock cycles for each bitwise calculation. As explained further in the discussion of FIG. 7A, in one embodiment, the encoder 622 and decoder 638 includes the fast CRC circuit 650 that includes 250 XOR logic gates that can encode and decode 72 bits of programming data (e.g., 64 bits of programming bits and 8 CRC bits).

Traditional CRCs conduct a bitwise XOR operation that requires a clock cycle for each iteration through a set (i.e., a word or frame) of programming data. The clock signal latches a programming data bit during each bitwise XOR operation as it progresses through the set of program data. Unlike traditional CRCs, the fast CRC can perform a CRC on two words (i.e., 16 bits) of programming data for each clock cycle. By pre-calculating the CRC, the fast CRC can remove the need for a traditional bitwise iteration through a set of program data thereby significantly increasing the speed at which the CRC operation occurs. For example, the fast CRC only requires a total of 4.5 clock cycles for 8 bytes of program data (i.e., 8 bytes of program data and 1 byte of CRC data), and 9 clock cycles for 16 bytes of program data (i.e., 8 bytes of program data and 2 bytes of CRC data).

Figure 7A:
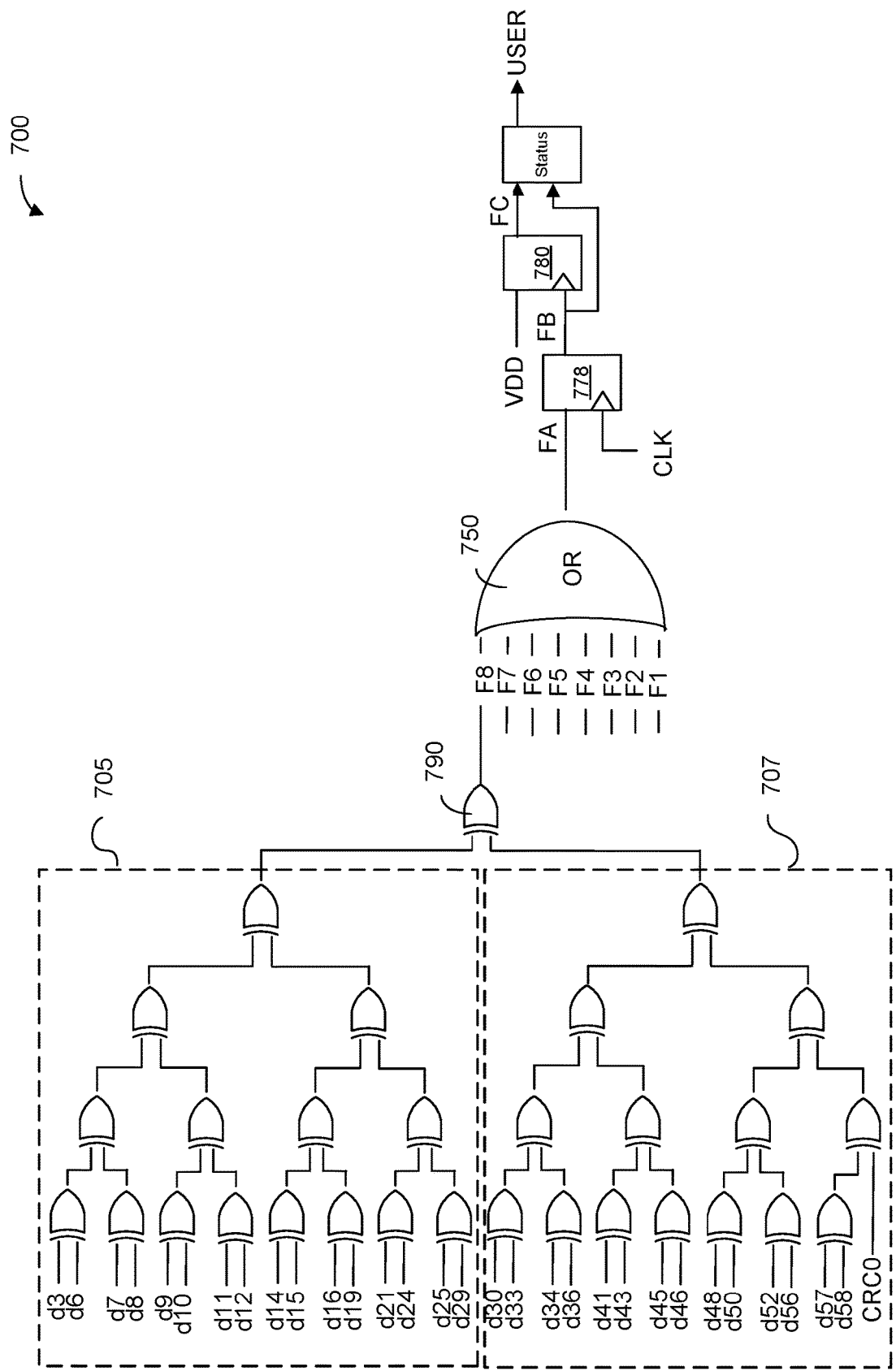
FIG. 7A is an example of a portion of a fast CRC circuit depicting one error flag implementation circuit, according to one embodiment.
Figure 7B:
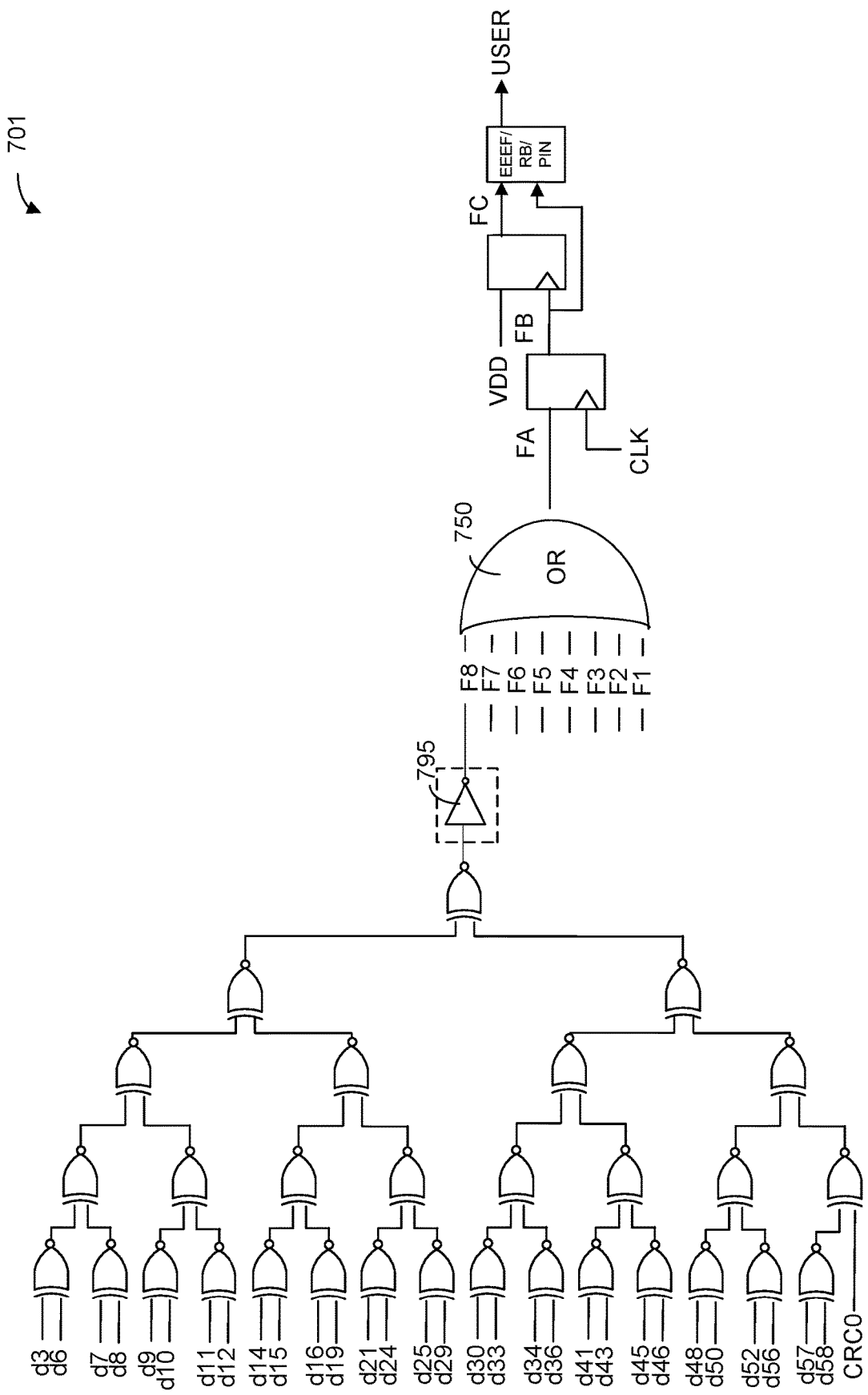
FIG. 7B is an example of a portion of a fast CRC circuit depicting one error flag implementation circuit, according to one embodiment.

The fast CRC circuit 650 includes one or more error flag implementation circuits 700. FIGS. 7A and 7B are each examples of a portion of a fast CRC circuit 650 (i.e., one error flag implementation circuit of the one or more error flag implementation circuits 700). In one embodiment, the fast CRC circuit includes 8 error flag implementation circuits that each return a value to denote an error in the programming data. Although a typical fast CRC circuit 650 will include 8 error flag implementation circuits, the fast CRC circuit is not limited to 8 error flag implementation circuits, and can include more or fewer error flag implementation circuits.

Each error flag implement circuit 700 corresponds to a byte of programming data. For example, a fast CRC circuit for pre-calculating 8 bytes of program data (and 1 byte of CRC data) includes 8 error flag implementation circuits. In one embodiment, a plurality of bits from a set of programming data (e.g., a plurality of bits from 8 bytes of programming data) are passed through each error flag implementation circuit 700. For example, as seen in FIGS. 7A and 7B, the plurality of (bites d3, d6, d7-d8, d9-d10, d11-d12, d16, d19, d21, d24, d25, d29-d30, d33-d34, d36, d41, d43, d45-d46, d48, d50, d52, d56-d58) are passed through an $8^{th}$ error flag implementation circuit 700. As seen in FIGS. 7A-7B, CRC0 represents the CRC code byte's bit 0 value. As explained in further detail below, in one embodiment, all 8 bits of CRC code will go through the 250 XOR gates for decoding.

In some embodiments a set (e.g., a frame) of programming data includes more than 8 bytes of programming data. The additional bytes (i.e., any number of bytes over 8 bytes) are passed through the 8 error flag implementation circuits after the first 8 bytes of data. For example if 16 bytes of programming data are passed into the fast CRC circuit, a first set of 8 bytes of data would be passed through 8 error flag implementation circuits. A second set of 8 bytes of data would be passed through the same 8 error flag implementation circuits after the first set. The output of each of the 8 error flag implementation circuits is passed through an OR logic gate. Here, each error flag implementation circuit 700 includes a plurality of combinational logic (i.e., cascaded) two-input exclusive OR (XOR) logic gates. The combinational logic includes the plurality of logic gates are coupled to each other such that the output of each logic gate is passed to a subsequent gate. For example, as seen in FIG. 7, the output of each logic gate creates a cascading structure that results in a final output.

As seen in FIG. 7A, the error flag circuit 700 includes a first set 705 and second set 707 of the plurality of logic gates. The first set 705 includes a first plurality of XOR gates. The second set 707 includes a second plurality of XOR gates. In this embodiment, the first set 705 of logic gates includes about 15 XOR logic gates, and second set 707 of logic gates includes about 14 XOR logic gates. In an alternative embodiment, the second set 707 of logic gates includes about 15 XOR logic gates. In some alternative embodiments, each error flag circuit 700 may include more or less than 30 XOR logic gates. The first set 705 and second set 707 of the plurality of logic gates creates a combinational logic that can be used to encode and decode programming data. Each error flag circuit 700 implements a portion of the fast CRC check operation. For example, a first error flag circuit 700 comprising about 30 XOR logic gates may implement ⅛ of the total operation. As the programming data is passed through each error flag circuit 700, the programming data is checked against the generator polynomial.

The plurality of error flag circuits 700 (e.g., 250 XOR gates) can be used to encode/decode the programming data. During an encoding operation, a CRC code of 0 is applied to the second set 707. For example, in one embodiment, all 8 CRC bit values are 0. The resulting non-0 output reminder is appended to the programming data. During a decoding operation, CRC code comprising a non-0 encoded remainder appended to the programming data, is applied as an input to the error flag circuit 700 to determine whether the error flag circuit 700 returns a 0 output remainder. In one embodiment, during the decoding operation, all 8 bits of CRC data will be applied as an input to the 250 XOR gates for decoding.

As seen further in FIG. 7A, the output from the first set 705 and the second set 707 of cascaded XOR logic gates is passed into XOR logic gate 790. Each error flag circuit 700 output is passed into an eight-input OR logic gate 750. For example, the output from the $8^{th}$ error flag circuit is passed into an eight-input OR gate. As seen in FIGS. 7A and 7B, the OR logic gate includes an input for the output of each error flag circuit of the fast CRC circuit. In this embodiment, $8^{th}$ error flag circuit output is passed into the eight-input OR logic gate 750. For example, in this embodiment, F8 is an input for an $8^{th}$ error flag circuit. If any of the error flag circuits return a value of 1, then the eight-input OR logic gate 750 will return a value of 1 signaling an error in the data. In one embodiment, the eight-input OR logic gate 750 is formed using 8 NOT logic gates (i.e., inverters), 6 AND logic gates, and 1 NAND logic gate. For example, in one configuration, each of the 8 error flag implementation circuit outputs can be passed through an inverter (e.g., 8 inverters). The output of each inverter can passed through an plurality of cascading AND logic gates (e.g., 4 two input AND gates outputting 4 values, which can be passed into 2 AND gates which return two values that can be passed into a NAND gate) and inverted to return a final value.

For a fixed polynomial, the CRC code can be pre-calculated using a pre-determined dataflow based on a flip-flop/XOR diagram. For example, at a specific step for a shift, each flip-flops output will change based on its input. Because the previous output will become the next input, each step's result can be forward calculated using one set of initial input. Thus, the pre-calculated CRC does not need to wait on a clock.

If any one of the 8 individual outputs from each of the 8 error flag implementation circuits returns a value of 1, the eight-input OR logic gate 750 will return a value of 1. For example if the $6^{th}$ error flag implementation circuit returns a value of 1, and the $1^{st}$-$5^{th}$, and $7^{th}$-$8^{th}$ error flag implementation circuits return a value 0, then the OR logic gate will return a value of 1. The output of the OR logic gate is coupled to a plurality of flip-flops, each flip-flop comprises a data input and a clock input. The clock input uses the received edge of the clock signal to latch a data input and hold the data as an output until the next clock edge comes. The first flip-flop 778, includes a first flag FA data input based on the combinational logic and a clock CLK signal input (e.g., an internal data path clock) connected to flip-flop 778. In one embodiment, each CLK cycle includes 72 bits (i.e., 64 programming data bits and 8 CRC bits). The first flag FA input will signal an error within each 64 bit set of programming data (i.e., within each quadword of programming data). The output of first flip-flop 778 is communicatively connected to the input of a second flip-flop 780. The output from the first flip-flop includes a second flag FB. The second flag FB returns a high voltage value (e.g., a voltage value greater than 0V) for an error within each 72 bit clock cycle. The second flip-flop 780 includes a positive supply voltage VDD applied as an additional input. The second flag FB is communicatively connected to the input of the status. Similarly to the second flag FB, the status will return a high voltage value for an error. However, the status will maintain a high voltage value for the entirety of the pre-calculation operation. In one embodiment, the second flag FB and status may include a half clock cycle delay.

For example, in one embodiment, because the first flag FA is a direct result from the combinational logic, the transition from the existing 72 bits to the next 72 bits can result in noise (i.e., an "unclean transition"). To avoid an unclean transition, a datapath clock signal can be used to latch data at a clean point from FA to get a clean FB. The second flag FB is an on-the-fly flag since it can keep changing to reflect an existing 72 bits error condition. However, some 72 bit error flags could be overwritten by later 72 bit clean flags. To avoid this, the third flag FC, (which will not be reset once a second flag FB goes high) is used. The second flag FB, and third flag FC can implemented based on a user's need. For example, a first user may only want/need to use the second flag FB to monitor which 72 bits of the total page transfer has error, while a second user may only want/need to use the third flag FC to know whether the total page transfer includes an error.

FIG. 7B is an example of a portion of the fast CRC circuit depicting one alternative error flag implementation circuit 701, according to one embodiment. In this embodiment, the alternative error flag circuit 701 includes a plurality of cascaded two-input exclusive NOR logic gates (XNOR). The output of the error flag circuit 701 includes an optional inverter logic gate 795. If the input includes an even number of bits, the output of the error flag circuit 701 includes the optional inverter logic gate 795. If the input is an odd number of bits, the output of the error flag circuit 701 does not include the optional inverter logic gate 795.

Figure 8:
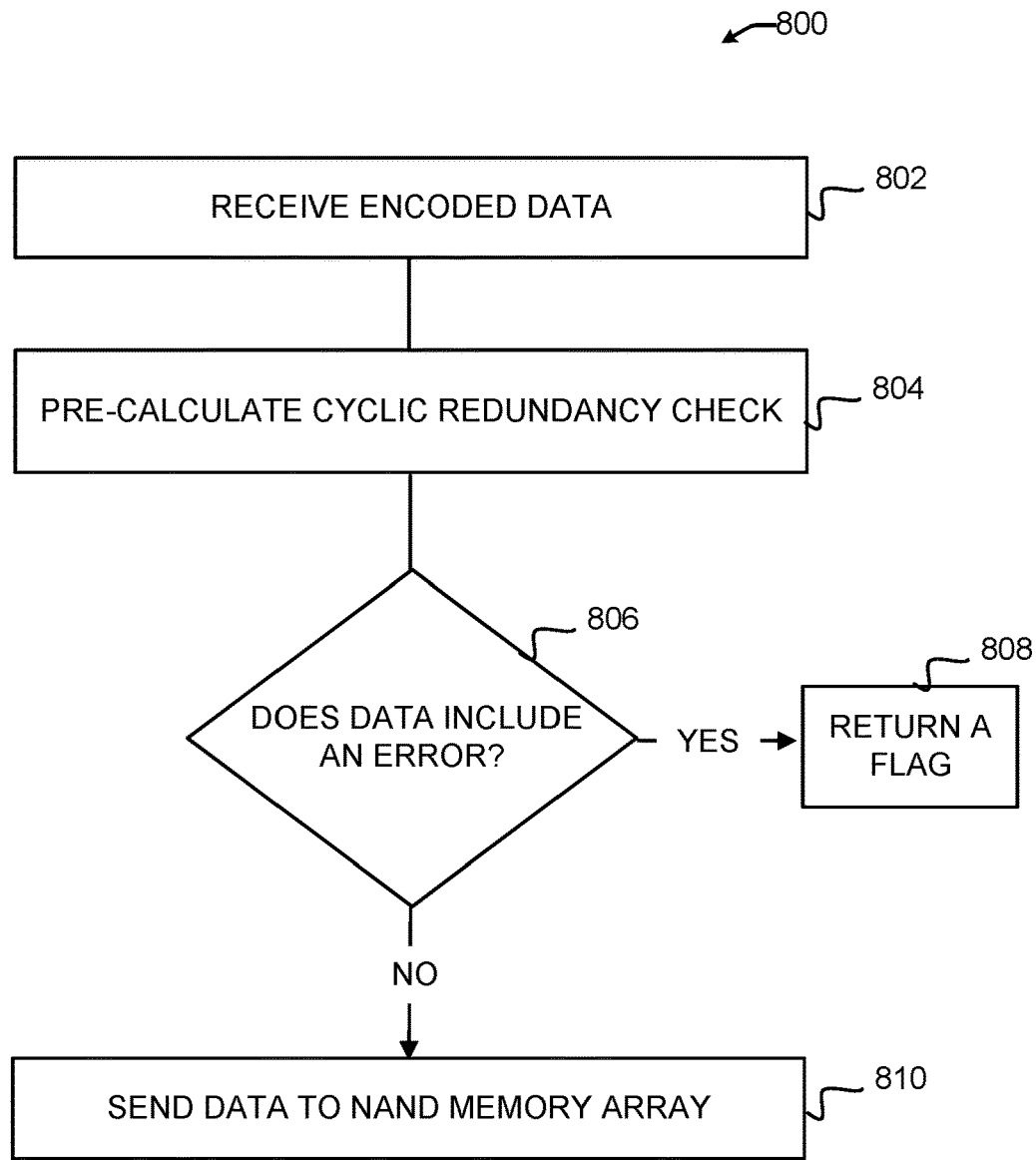
FIG. 8 depicts a method of implementing the fast CRC, according to one embodiment.

FIG. 8 is a method of implementing the fast CRC circuit, according to one embodiment. The method 800 includes receiving encoded data, pre-calculating the cyclic redundancy check (CRC) to determine whether the data includes an error, and passing (i.e., sending) the data to the NAND memory array if the data does not include an error. If the data includes an error, the fast CRC returns a flag.

At activity 802, the method 800 include receiving encoded data from a decoder. The encoded data includes programming data and CRC data. For example, in one embodiment, 8 bytes (i.e., 64 bits) of programming data, and 1 byte (i.e., 8 bits) of CRC data sent from the encoder 622 to the decoder 638 as encoded data. The encoded data can be sent from the encoder 622 to the decoder 638 along the bus 542. Alternatively, in configurations where the encoder is located on a user device, the encoded data can be received by the decoder 638 via an I/O pin. Once the encoded data is received by the decoder 638, the decoder 638 performs the fast cyclic redundancy check (CRC) according to activity 804.

At activity 804, the method 800 includes pre-calculating the CRC. Unlike traditional CRC operations that requires a bitwise operation to iterates through each bit of a word, the pre-calculation operation passes the entire frame of encoded programming data, comprising one or more words, through the fast CRC circuit 650 (e.g., a fly-by pre-calculation). Each byte of the encoded programming data is passed through each error flag implementation circuit 700. For example, in one embodiment 9 bytes of encoded programming data (8 bytes of programming data and 1 bytes of CRC) are passed through 8 error flag implementation circuits 700. In another embodiment, 18 bytes of encoded programming data (16 bytes of programming data and 2 bytes of CRC) are passed through 8 error flag implementation circuits 700.

As previously mentioned, each frame of encoded data includes a plurality of words of encoded data. Each word can includes a plurality of bits of programming data or CRC data. Each clock cycle can pass one word (i.e., two bytes (i.e., 16 bits)) of encoded data through the 8 error flag implementation circuits 700. For example, a frame comprising 4 words (i.e., 8 bytes (i.e., 64 bits)) of programming data and 1 halfword (i.e., 1 byte (i.e., 16 bits) of CRC data can be pre-calculated in 4.5 clock cycle. Thus, unlike a traditional CRC that requires a clock cycle for each shift, passing 8 bytes of encoded memory through each error flag implementation circuit 700 only requires 4.5 clock cycles (i.e., 4 clock cycles for 8 bytes of programming data, and ½ a clock cycle for 1 bytes of CRC data). Furthermore, two quadwords of programming data (i.e., 16 bytes programming data) of programming data, and one word (i.e., 2 bytes) of CRC data can be passed through each error flag implementation circuit 700 in 9 clock cycles (i.e., 8 clock cycles for 16 bytes of programming data, and 1 clock cycle for 2 bytes of CRC data). Reducing the amount of clock cycles significantly increases the speed of the CRC calculation since traditional CRCs require multiple clock cycles to perform a bitwise iteration through each bit in a word.

The output from each error flag implementation circuit 700, comprising a combinational logic comprising a plurality of two-input logic gates (e.g., XOR logic gates or XNOR logic gates), is passed into an OR logic gate. At activity 806 the method 800 includes determining whether any one of the 8 individual outputs (F1-F8) from each of the 8 error flag implementation circuits returns a value of 1. If any one of the 8 individual outputs (F1-F8) from each of the 8 error flag implementation circuits return a value of 1, the OR logic gate will return a value of 1 (e.g., the error flag implementation circuit 700 will return a flag at activity 808). The first flag will signal an error within each 64 bit set of programming data (i.e., within each quadword of programming data). The second flag FB will signal an error within each 64 bit set of programming data by returning a high voltage value (e.g., a voltage value greater than 0V) for an error within each 72 bit clock cycle, and the third flag FC will signal an error within the entire frame of encoded data by returning a high voltage value once any error if found (e.g., if a value of 1 is returned at any point by the OR logic gate coupled to each output of each error flag implementation circuit 700).

For example, in one embodiment, the first flag FA is the direct result of the combinational logic. To avoid an unclean transition from the existing 72 bits to the next 72 bits, a data path CLK signal can be used to latch data at a clean point from FA to get a clean FB. The second flag FB is an on-the-fly flag because it can keep changing to reflect an exiting 72 bit error condition. However, some 72 bit error flags can be overwritten by a later 72 bit condition. To avoid this, the third flag FC, which will not reset once a second flag FB goes high, is used.

At activity 810, the method 800 includes sending the programming data to the NAND memory array 612, if no errors are found during the fast CRC operation. If no errors were found (e.g., no flags were returned at activity 808) the programming data is sent to the NAND memory array 612 via bus 635 for programming into a plurality of memory cells within the NAND memory array 612.

The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

It is intended that the foregoing be understood as an illustration of selected forms that the invention can take and not as a definition of the invention. Finally, it should be noted that any aspect of any of the preferred embodiments described herein can be used alone or in combination with one another.

What is claimed is:

1. A method of detecting errors in programming data comprising:
    receiving a frame of encoded data comprising a plurality of words comprising a plurality of programming bits and one or more or cyclic redundancy check (CRC) bits;
    performing a pre-calculation operation on the encoded data, wherein the pre-calculation operation comprises:
        passing the frame of encoded data through an error detection circuit comprising:
            at least eight error flag implementation circuits, wherein each error flag implementation circuit comprises 250 cascaded two-input logic gates configured to collectively perform a mathematical equation to return a single output value, for the respective error flag implementation circuit, from a plurality of input values; and
            an eight input OR logic gate, coupled to each output of each error flag implementation circuit, and wherein the eight input OR logic gate is configured to receive the single output values from each of the error flag implementation circuits and return an error flag if one or more output values return a value of 1; and
    determining, based on the error flag, whether one or more words within the frame of encoded data contain errors.

2. The method of claim 1, wherein the 250 cascaded two-input logic gates comprise 250 XOR logic gates, and wherein the eight input OR logic gate comprises 8 NOT gates, 6 AND gates, and 1 NAND gate.

3. The method of claim 1, wherein the 250 cascaded two-input logic gates comprise 250 XNOR gates, and wherein the eight input OR logic gate comprises 8 NOT gates, 6 AND gates, and 1 NAND gate.

4. The method of claim 1, wherein the frame of encoded data comprises 8 bytes of programming data and one byte of CRC data.

5. The method of claim 1, wherein the pre-calculation operation comprises a fly-by operation.

6. The method of claim 1, wherein a first error flag is configured to return a high voltage value for a first period of time if an error is found in the programming data.

7. The method of claim 1, further comprising:
    performing a programming operation on the frame of programming data to program one or more cyclic redundancy check (CRC) bits, wherein the programming operation comprises appending the one or more CRC bits to an end of the frame of the programming data.

8. The method of claim 1,
    wherein the 250 cascaded two-input logic gates are arranged in a plurality of levels, each level of the plurality of levels comprising a subset of the 250 cascaded two-input logic gates,
    wherein passing the frame of encoded data through the error detection circuit comprises passing a programming bit of the frame of encoded data through each input of a first subset of the 250 cascaded two-input logic gates of a first level of the plurality of levels.

9. A circuit for pre-calculating a cyclic redundancy check comprising:
    at least eight error flag implementation circuits, wherein each error flag implementation circuit comprises 250 cascaded two-input logic gates configured to receive encoded data and perform a pre-calculation operation to return a single output value, for the respective error flag implementation circuit, from a plurality of input values in the encoded data, and wherein the pre-calculation operation returns a value of 1 for an error in encoded data;
    an eight input OR logic gate communicatively coupled to each output of each error flag implementation circuit, wherein the eight input OR logic gate is configured to receive the single output values from each of the error flag implementation circuits and a return a value of 1 for any error in any error flag implementation circuit; and
    a plurality of flip flop logic gates coupled to the output of the eight input OR logic gate, wherein each flip flop is configured to signal an error.

10. The circuit of claim 9, wherein the 250 cascaded two-input logic gates comprises 250 XOR logic gates, and wherein the eight input OR logic gate comprises 8 NOT gates, 6 AND gates, and 1 NAND gate.

11. The circuit of claim 9, wherein the 250 cascaded two-input logic gates comprises 250 XNOR gates, and wherein the eight input OR logic gate comprises 8 NOT gates, 6 AND gates, and 1 NAND gate.

12. The circuit of claim 9, wherein the encoded data comprises 8 bytes of programming data and one byte of CRC data.

13. The circuit of claim 9, wherein the encoded data comprises 16 bytes of programming data and two bytes of CRC data.

14. The method of claim 1, wherein each input of a subset of the 250 cascaded two-input logic gates receives a bit of data of the encoded data.

15. The circuit of claim 9, wherein each input of a subset of the 250 cascaded two-input logic gates receives a bit of data of the encoded data.

16. A non-transitory computer readable storage medium storing instructions that, when executed by a processor, cause the processor to:
   perform a pre-calculation operation on encoded data, wherein the pre-calculation operation comprises:
      passing a frame of encoded data through an error detection circuit comprising:
         at least eight error flag implementation circuits, wherein each error flag implementation circuit comprises 250 cascaded two-input logic gates configured to collectively perform a mathematical equation to return a single output value, for the respective error flag implementation circuit, from a plurality of input values; and
         an eight input OR logic gate, coupled to each output of each error flag implementation circuit, wherein the eight input OR logic gate is configured to receive the single output values from each of the error flag implementation circuits and return an error flag if one or more output values return a value of 1; and
      determining, based on the error flag, whether one or more words within the frame of encoded data contain errors.

17. The non-transitory computer readable storage medium of claim 16, wherein the 250 cascaded two-input logic gates comprise 250 cascaded two-input XNOR logic gates.

18. The non-transitory computer readable storage medium of claim 16, wherein the 250 cascaded two-input logic gates comprise 250 XOR logic gates, and wherein the eight input OR logic gate comprises 8 NOT gates, 6 AND gates, and 1 NAND gate.

19. The non-transitory computer readable storage medium of claim 16, wherein the 250 cascaded two-input logic gates comprises 250 XNOR gates, and wherein the eight input OR logic gate comprises 8 NOT gates, 6 AND gates, and 1 NAND gate.

20. The non-transitory computer readable storage medium of claim 16, wherein the frame of encoded data comprises 8 bytes of programming data and one byte of CRC data.

21. The non-transitory computer readable storage medium of claim 16, wherein the frame of encoded data comprises 16 bytes of programming data and two bytes of CRC data.

22. The non-transitory computer readable storage medium of claim 16, further comprising:
   performing a programming operation on the frame of programming data to program one or more cyclic redundancy check (CRC) bits, wherein the programming operation comprises appending the one or more CRC bits to an end of the frame of the programming data.

23. The non-transitory computer readable storage medium of claim 16, wherein a first flag is configured to return a high voltage value for a first period of time if an error is present in the encoded data.

* * * * *